United States Patent
Asami et al.

(10) Patent No.: US 7,030,414 B2
(45) Date of Patent: Apr. 18, 2006

(54) III GROUP NITRIDE COMPOUND SEMICONDUCTOR LUMINESCENT ELEMENT

(75) Inventors: Shinya Asami, Aichi (JP); Hiroshi Watanabe, Aichi (JP); Jun Ito, Aichi (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/472,544

(22) PCT Filed: Apr. 22, 2002

(86) PCT No.: PCT/JP02/03996

§ 371 (c)(1),
(2), (4) Date: Sep. 23, 2003

(87) PCT Pub. No.: WO02/089220

PCT Pub. Date: Nov. 7, 2002

(65) Prior Publication Data

US 2004/0113169 A1    Jun. 17, 2004

(30) Foreign Application Priority Data

Apr. 25, 2001 (JP) ............................ 2001-128507
Jun. 4, 2001 (JP) ............................ 2001-167589

(51) Int. Cl.
*H01L 27/15* (2006.01)

(52) U.S. Cl. ..................... 257/79; 257/13; 257/94; 257/96; 257/99; 257/103; 257/918

(58) Field of Classification Search ........... 257/79–103
See application file for complete search history.

(56) References Cited

U.S. PATENT DOCUMENTS

| 5,777,350 | A | | 7/1998 | Nakamura et al. |
| 6,057,565 | A | * | 5/2000 | Yoshida et al. ............. 257/102 |
| 6,329,667 | B1 | * | 12/2001 | Ota et al. ..................... 257/13 |
| 6,479,836 | B1 | * | 11/2002 | Suzuki et al. ................. 257/15 |

FOREIGN PATENT DOCUMENTS

| EP | 0 772 249 A2 | 5/1997 |
| EP | 1 014 455 A1 | 6/2000 |
| EP | 1 018 770 A1 | 7/2000 |
| EP | 1 076 390 A2 | 2/2001 |
| JP | 6-053549 | 2/1994 |
| JP | 7-183576 | 7/1995 |
| JP | 9-139543 | 5/1997 |
| JP | 10-150219 | 6/1998 |
| JP | 10-163523 | 6/1998 |
| JP | 11-233824 | 8/1999 |
| JP | 11-243251 | 9/1999 |
| JP | 11-251685 | 9/1999 |
| JP | 2000-261106 | 9/2000 |
| JP | 2001-015443 | 1/2001 |
| TW | 419837 | 1/2001 |

* cited by examiner

*Primary Examiner*—Long Pham
*Assistant Examiner*—Wai-Sing Louie
(74) *Attorney, Agent, or Firm*—McGinn IP Law Group, PLLC

(57) ABSTRACT

A Group III nitride compound semiconductor light-emitting device includes a multilayer having a quantum well structure containing an InGaN well layer and an AlGaN barrier layer. The film thickness, growth rate and growth temperature of the InGaN layer as the well layer and the film thickness of the AlGaN layer as the barrier layer are controlled to be optimized to thereby improve an output of the light-emitting device.

20 Claims, 12 Drawing Sheets

US 7,030,414 B2

III GROUP NITRIDE COMPOUND SEMICONDUCTOR LUMINESCENT ELEMENT

TECHNICAL FIELD

The present invention relates to a Group III nitride compound semiconductor light-emitting device. Particularly, it relates to a Group III nitride compound semiconductor light-emitting device for emitting light at a relatively short wavelength.

BACKGROUND ART

A Group III nitride compound semiconductor light-emitting device is known as a light-emitting diode for emitting light in a color ranging from blue to green. The Group III nitride compound semiconductor light-emitting device is also used as a light-emitting diode for emitting light at a shorter wavelength (in a range of from near-ultraviolet to ultraviolet) than the wavelength of visible light.

Although the Group III nitride compound semiconductor light-emitting device emitting light at such a short wavelength is heretofore known, higher light-emitting efficiency and output have been required of the light-emitting device recently.

DISCLOSURE OF THE INVENTION

The present inventors have made eager examination to improve the Group III nitride compound semiconductor light-emitting device emitting light at a short wavelength. As a result, a light-emitting device having the following configuration has been conceived. That is, there is provided a Group III nitride compound semiconductor light-emitting device including: a multilayer containing a quantum well structure having an InGaN well layer and an AlGaN barrier layer; and an intermediate layer of InGaN thicker than the InGaN well layer and disposed below the multilayer.

According to the Group III nitride compound semiconductor light-emitting device configured as described above, light at a short wavelength, e.g., a wavelength of 360–550 nm can be emitted with a high output compared with the conventional device.

Moreover, a multilayer containing a quantum well structure having an InGaN well layer and an AlGaN barrier layer is employed, and the film thickness, growth rate and growth temperature of each of the InGaN layers as the well layers and the film thickness of each of the AlGaN layers as the barrier layers are controlled to be optimized. Accordingly, the output of the Group III nitride compound semiconductor light-emitting device is improved.

In addition, the intermediate layer which serves as an undercoat layer for the multilayer is also optimized. Also from this point of view, improvement in output of the Group III nitride compound semiconductor light-emitting device is attained.

BEST MODE FOR CARRYING OUT THE INVENTION

Figure 1:
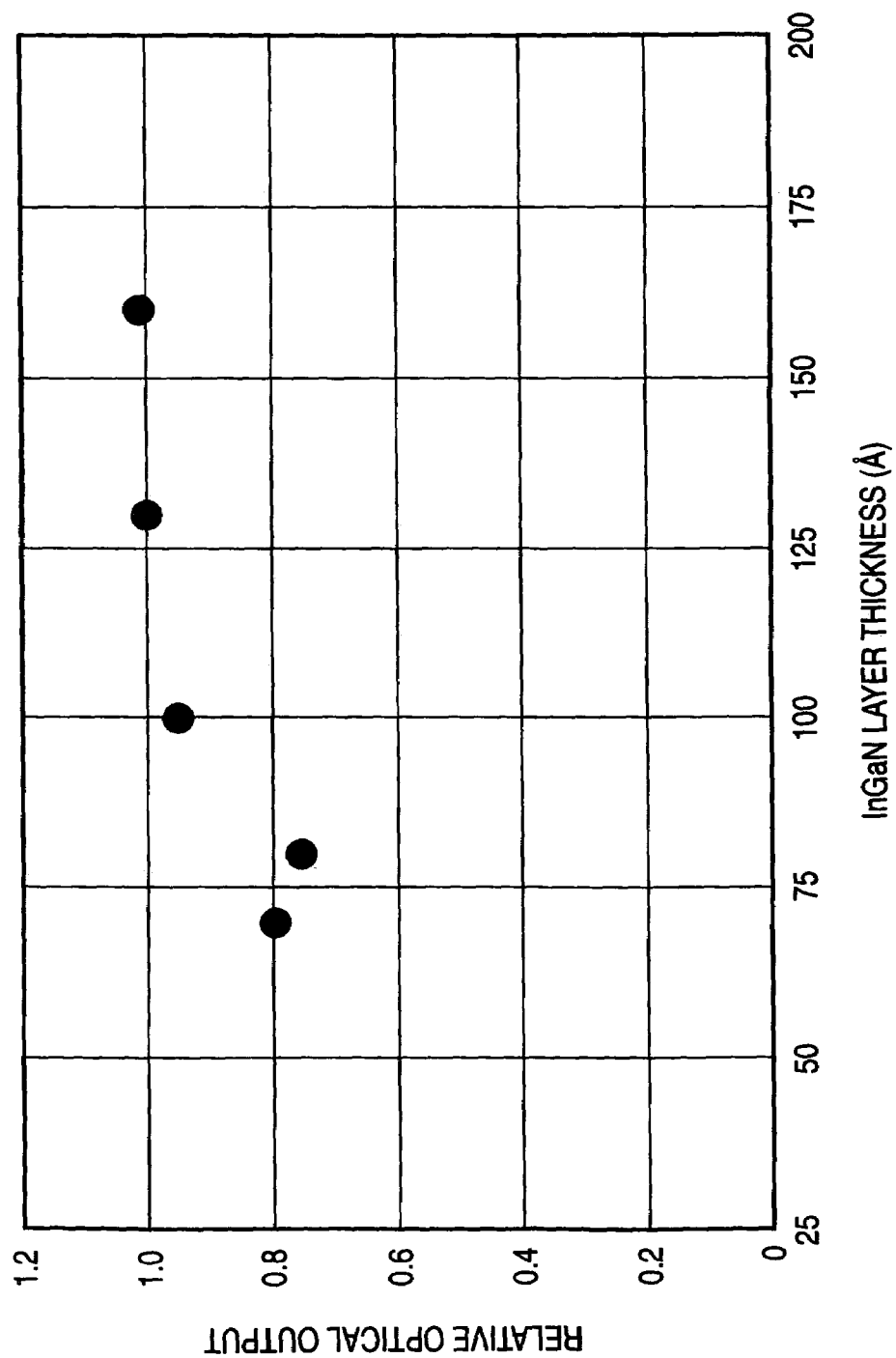
FIG. 1 shows the relation between the film thickness of each InGaN layer as a well layer and the light-emitting intensity of a light-emitting device.

The present invention will be described below in detail.

According to an aspect of the invention, the wavelength range aiming at improving the light-emitting output is 360–550 nm but the wavelength range is not particularly limited. The wavelength range aiming at improving the light-emitting output in the invention is more preferably 360–520 nm, more and more preferably 360–490 nm, more and more and more preferably 360–460 nm, most preferably 360–430 nm.

In this description, each Group III nitride compound semiconductor is represented by the general formula $Al_X Ga_Y In_{1-X-Y} N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_X Ga_{1-X} N$, $Al_X In_{1-X} N$ and $Ga_X In_{1-X} N$ ($0 < x < 1$ in the above). The group III elements may be at least partially replaced by boron (B), thallium (Tl), or the like. The nitrogen (N) may be at least partially replaced by phosphorus (P), arsenic (As), antimony (Sb), bismuth (Bi), or the like. Each Group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, after doped with p-type impurities, the Group III nitride compound semiconductor may be subjected to electron beam irradiation, plasma irradiation or heating due to a furnace but this process is not essential. A method for forming the Group III nitride compound semiconductor layer is not particularly limited. Besides a metal organic chemical vapor deposition method (MOCVD method), the Group III nitride compound semiconductor layer can be formed by a known method such as a molecular beam epitaxy method (MBE method), a halide vapor phase epitaxy method (HVPE method), a sputtering method, an ion-plating method, an electron showering method, or the like.

In this invention, specific Group III nitride compound semiconductors are used for forming specific layers respectively.

In the invention, the multilayer contains an InGaN well layer and an AlGaN barrier layer which is a light-emitting layer. The multilayer has a laminated structure in which each of the InGaN well layers is sandwiched between AlGaN layers.

In another aspect, the multilayer is configured so that a unit pair made of a laminate of an AlGaN layer and an InGaN well layer is laminated or two or more unit pairs are laminated, and an AlGaN layer or a GaN layer is finally laminated. That is, the p-type layer side uppermost layer is an AlGaN layer or a GaN layer. On the other hand, the intermediate layer side lowermost layer is also an AlGaN layer or a GaN layer. A combination of the uppermost layer of AlGaN and the lowermost layer of AlGaN, a combination of the uppermost layer of AlGaN and the lowermost layer of GaN or a combination of the uppermost layer of GaN and the lowermost layer of GaN is preferable.

The number of unit pairs is selected to be preferably 1–10, more preferably 2–8, more and more preferably 3–7, more and more and more preferably 3–6, most preferably 3.5.

The wavelength of emitted light entirely depends on the compositional ratio of In and Ga in the InGaN well layer.

In order to emit short-wavelength light, the compositional ratio of In is selected to be preferably 1–20%, more preferably 1–15%, more and more preferably 1–10%, most preferably 1–8%.

FIG. 1 shows the relation between the film thickness of each InGaN layer as a well layer and the light-emitting intensity of the light-emitting device at 20 mA (hereinafter, the light-emitting intensity of the light-emitting device expresses light-emitting intensity at the time of application of 20 mA if no special notice is given). A result of FIG. 1 is obtained when the thickness of each of InGaN well layers forming the multilayer is changed as shown in the horizontal axis in the light-emitting device 1 shown in Embodiments (see FIGS. 6 and 7).

It is obvious from the result of FIG. 1 that the film thickness of each InGaN well layer is selected to be preferably 90–200 Å (9.0–20.0 nm), more preferably 100–175 Å (10.0–17.5 nm).

Figure 2:
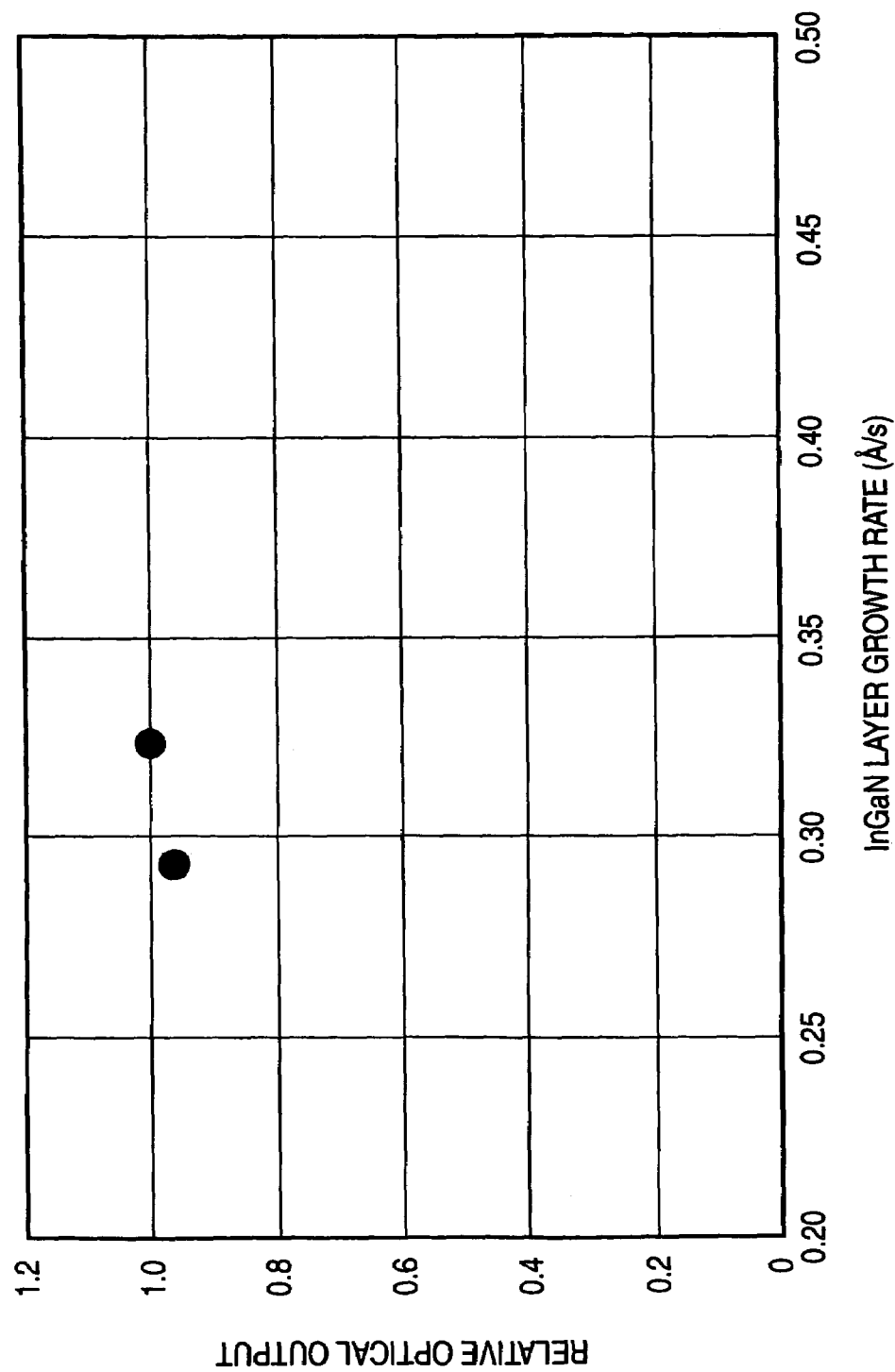
FIG. 2 shows the relation between the growth rate of each InGaN well layer and the light-emitting intensity of the light-emitting device.

FIG. 2 shows the relation between the growth rate of each InGaN well layer and the light-emitting intensity of the light-emitting device.

A result of FIG. 2 is obtained when the growth rate of each of InGaN well layers forming the multilayer is changed as shown in the horizontal axis in the light-emitting device shown in Embodiments.

It is obvious from the result of FIG. 2 that the growth rate of each InGaN well layer is selected to be preferably 0.25–0.35 Å/s (0.025–0.035 nm/s).

For obtaining the result of FIG. 2, the flow rate of material gas (TMG, TMI, ammonia) is changed to control the growth rate.

Figure 3:
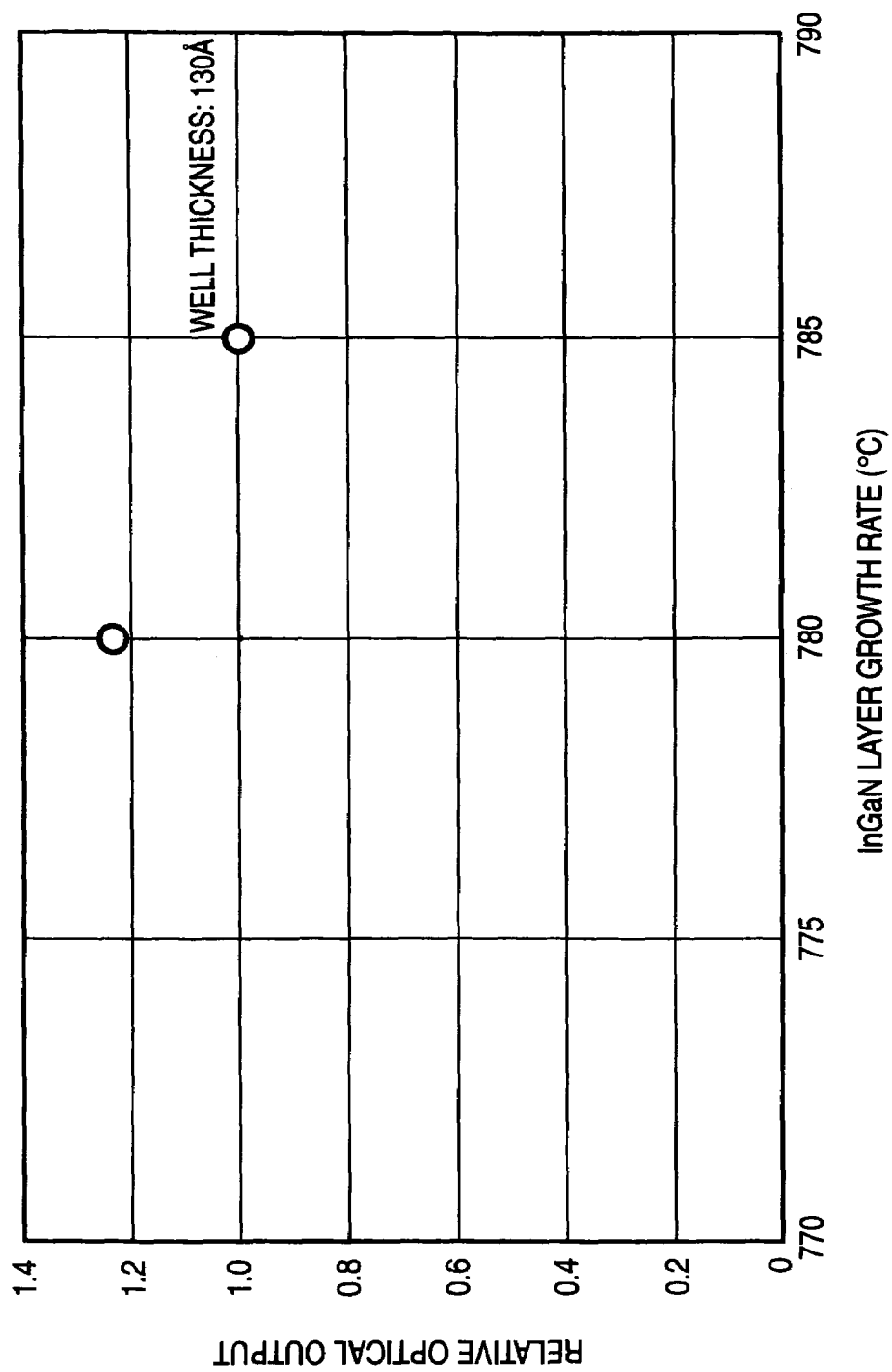
FIG. 3 shows the relation between the growth temperature of each InGaN well layer and the light-emitting intensity of the light-emitting device.

FIG. 3 shows the relation between the growth temperature of each InGaN well layer and the light-emitting intensity of the light-emitting device.

A result of FIG. 3 is obtained when the growth temperature of each of InGaN well layers forming the multilayer is changed as shown in the horizontal axis in the light-emitting device shown in Embodiments.

From the result of FIG. 3, the growth temperature of each InGaN well layer is selected to be preferably 770–790° C., more preferably 777–783° C.

Figure 4:
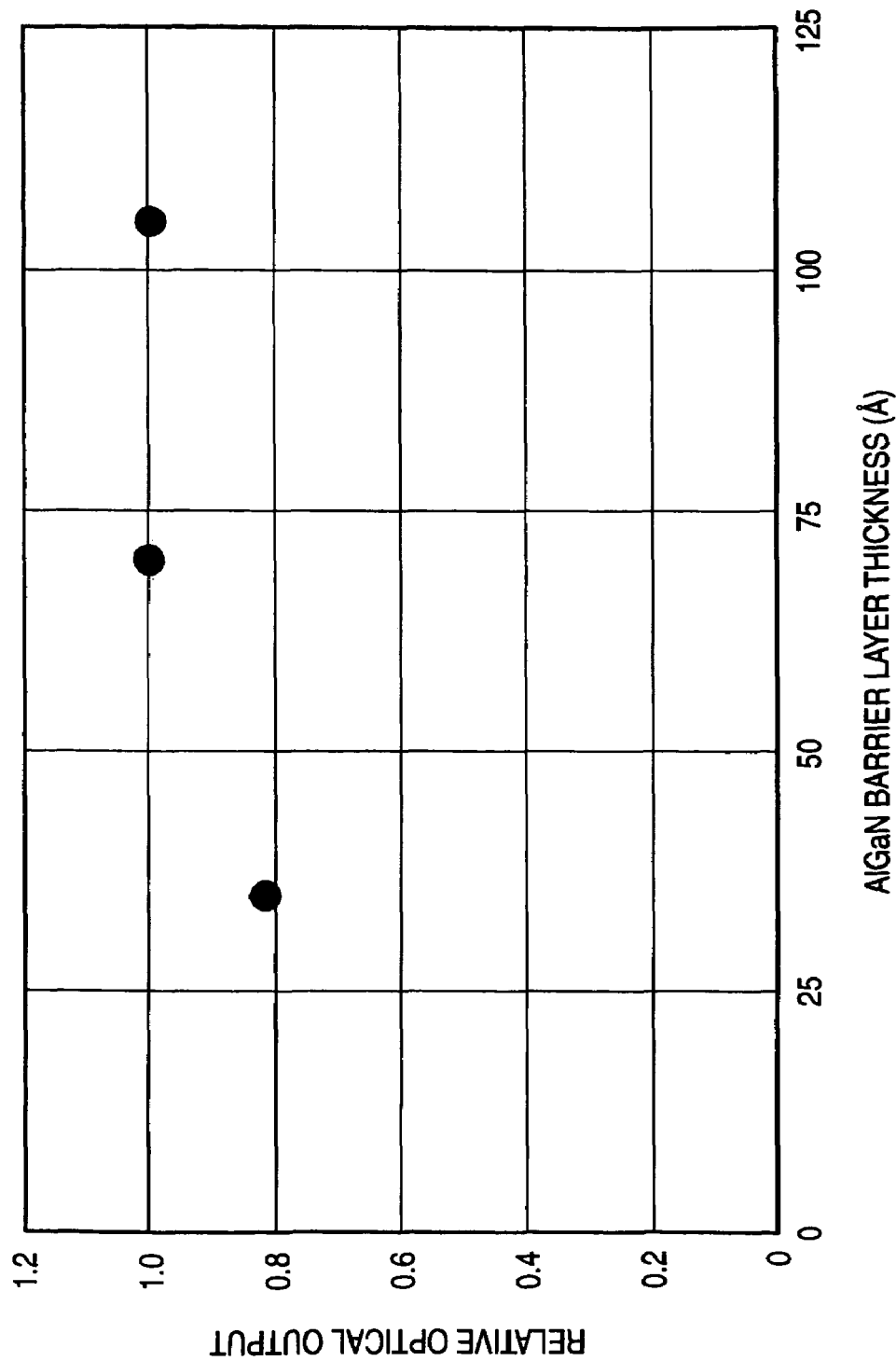
FIG. 4 shows the relation between the film thickness of each AlGaN layer as a barrier layer and the light-emitting intensity of the light-emitting device.

FIG. 4 shows the relation between the film thickness of each AlGaN layer as a barrier layer and the light-emitting intensity of the light-emitting device. A result of FIG. 4 is obtained when the thickness of each AlGaN layer is changed as shown in the horizontal axis in the light-emitting device shown in Embodiments.

It is obvious from the result of FIG. 4 that the film thickness of each AlGaN layer is selected to be preferably 50–125 Å (5.0–12.5 nm).

Incidentally, the uppermost layer in the multilayer is preferably formed to be thicker by 10–30% than any other barrier layers because the uppermost layer serves as a cap layer.

In a further aspect of the invention, attention is paid to an intermediate layer under the multilayer. The intermediate layer is obtained by laminating a first intermediate layer of InGaN, a second intermediate layer of GaN and a third intermediate layer of AlGaN successively. Preferably, each of the first, second and third intermediate layers is not doped. The third intermediate layer of AlGaN may be omitted. If the second intermediate layer of GaN is omitted, the third intermediate layer of AlGaN becomes the second intermediate layer. The second intermediate layer may be also regarded as a laminate of a GaN layer and an AlGaN layer.

Figure 5:
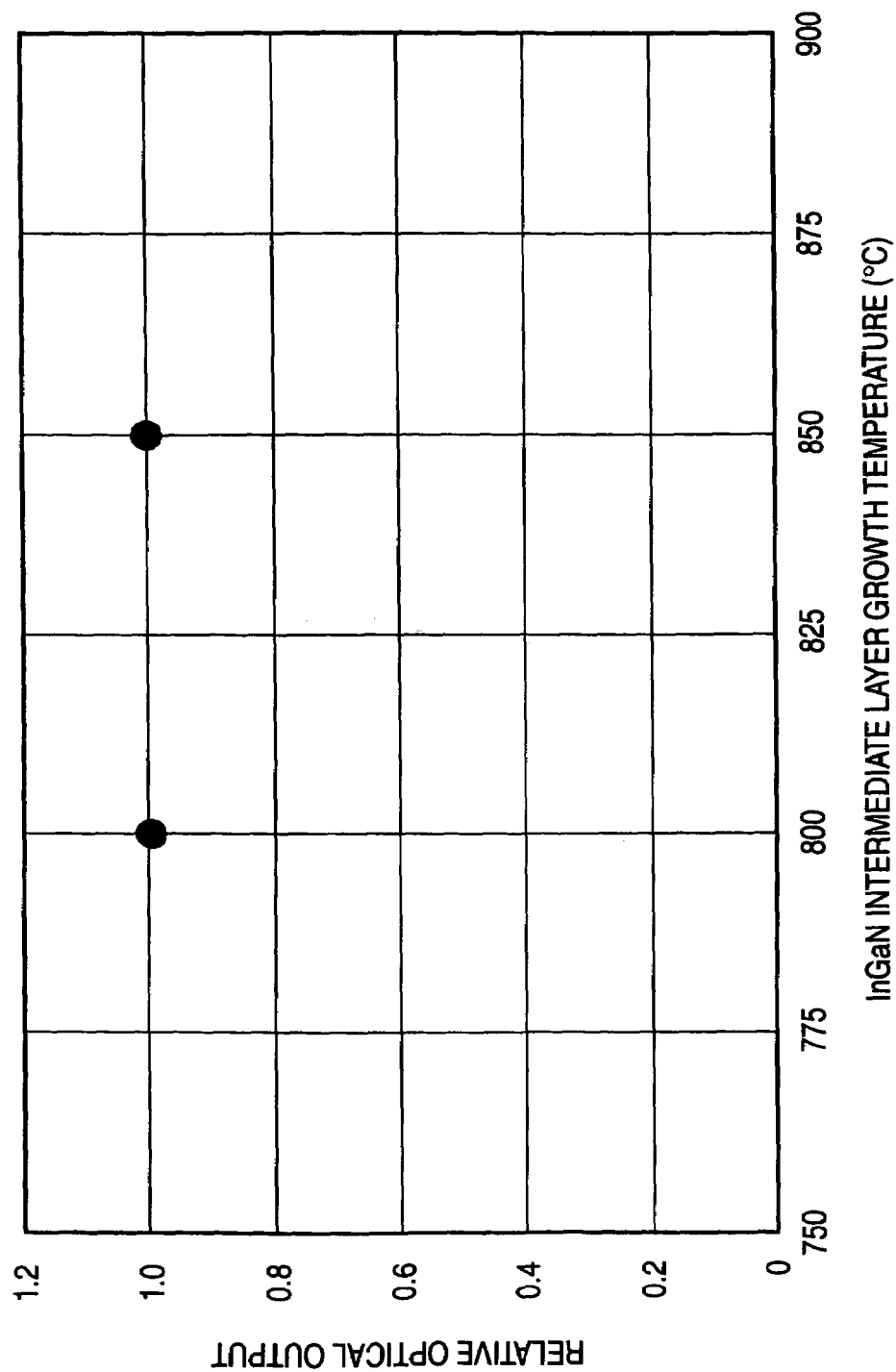
FIG. 5 shows the relation between the growth temperature of a first intermediate layer of InGaN and the light-emitting intensity of the light-emitting device.

FIG. 5 shows the relation between the growth temperature of the first intermediate layer of InGaN and the light-emitting intensity of the light-emitting device.

A result of FIG. 5 is obtained when the growth temperature of the first intermediate layer of InGaN is changed as shown in the horizontal axis in the light-emitting device shown in Embodiments.

From the result of FIG. 5, the growth temperature of the first intermediate layer of InGaN is selected to be preferably 770–875° C., more preferably 800–850° C.

According to the inventors' more examination, it has been found that a preferred light-emitting output is obtained also when the InGaN well layers and the AlGaN barrier layers are provided in the following conditions. That is, in the conditions shown in FIGS. 10, 11 and 12, a preferred light-emitting output is obtained particularly at a wavelength of 360–430 nm.

Figure 6:
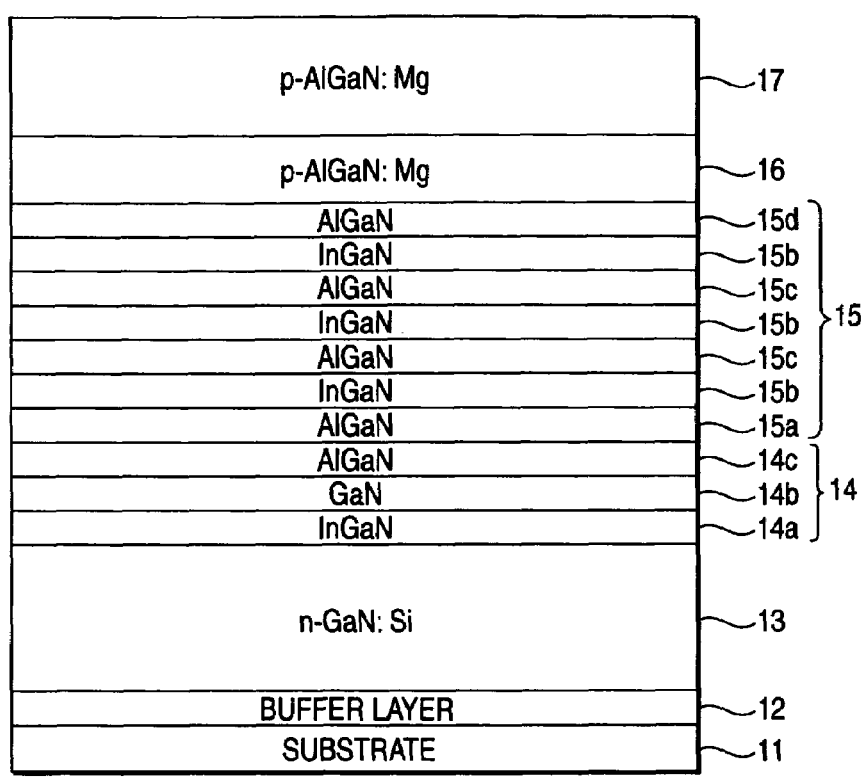
FIG. 6 shows Group III nitride compound semiconductor layers in a light-emitting device according to an embodiment of the invention.
Figure 7:
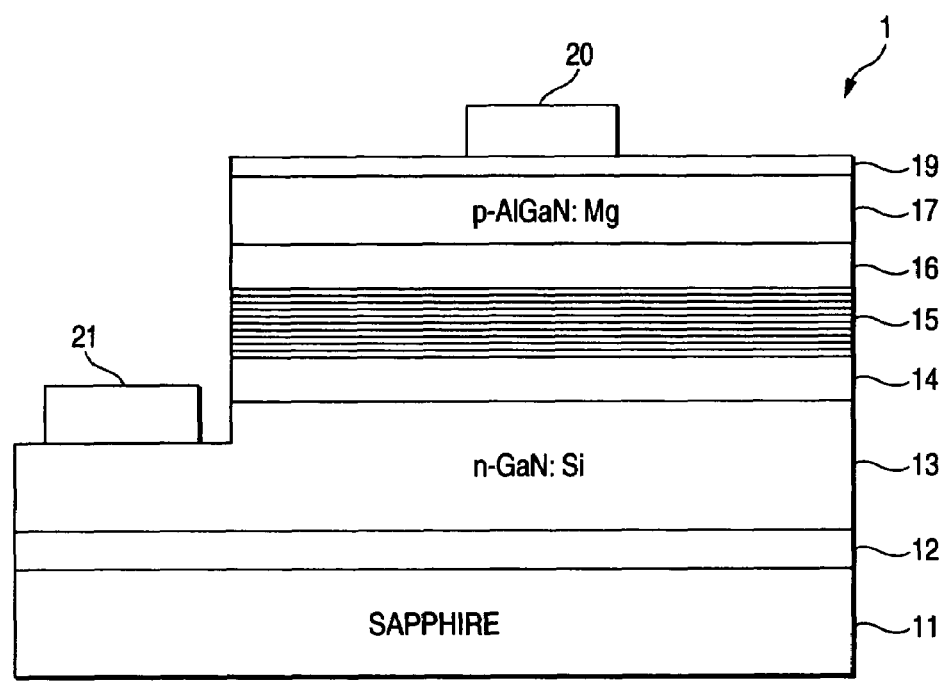
FIG. 7 shows a configuration of the light-emitting device according to this embodiment of the invention.
Figure 10:
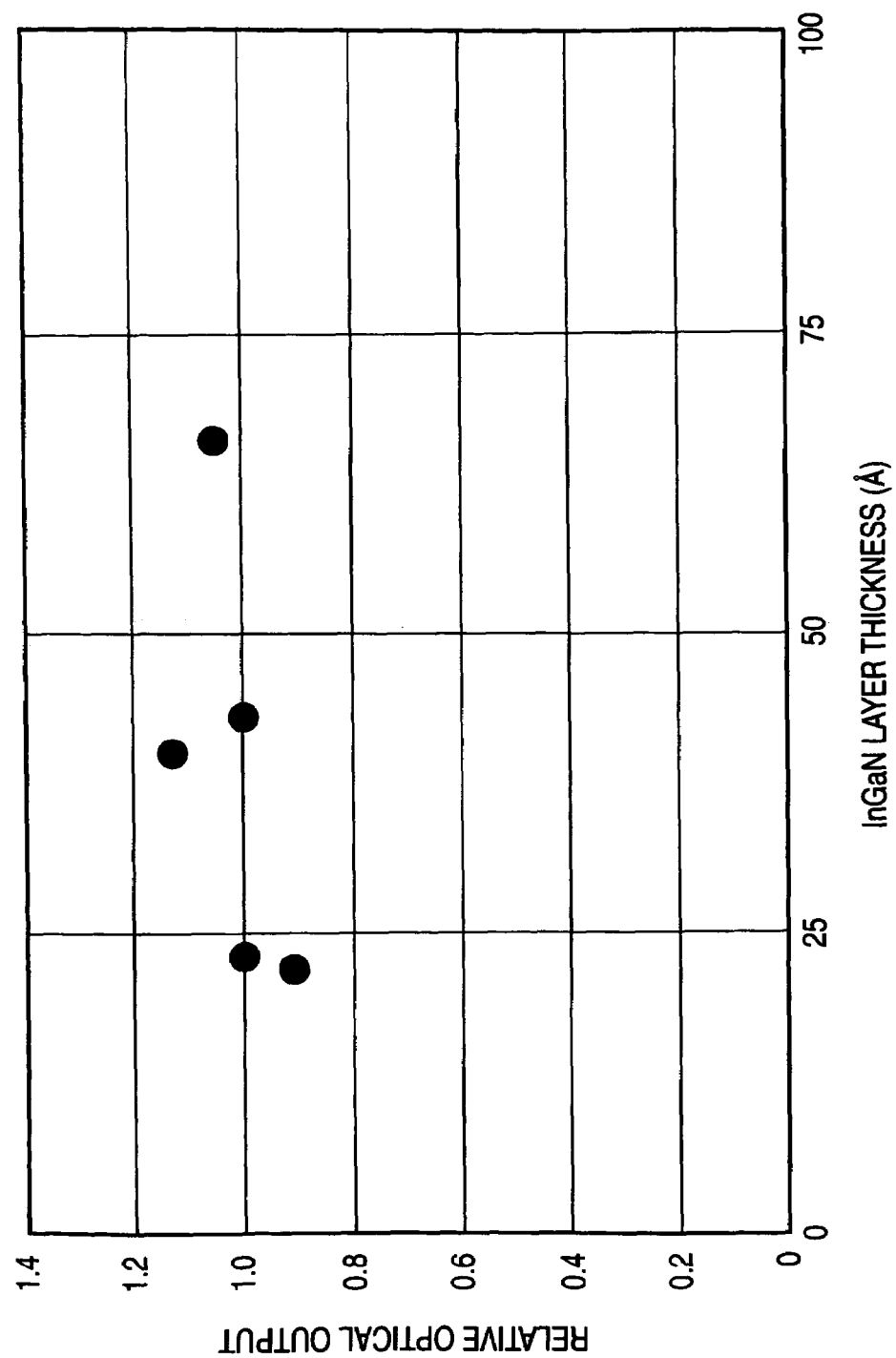
FIG. 10 shows the relation between the film thickness of each InGaN layer as a well layer and the light-emitting intensity of a light-emitting device.

A result of FIG. 10 is obtained when the thickness of each of InGaN well layers forming the multilayer is changed as shown in the horizontal axis in the light-emitting device 1 shown in Embodiments (see FIGS. 6 and 7). It is obvious from the result of FIG. 10 that the film thickness of each InGaN well layer is selected to be preferably 20–60 Å (2.0–6.0 nm), more preferably 35–50 Å (3.5–5.0 nm).

Figure 11:
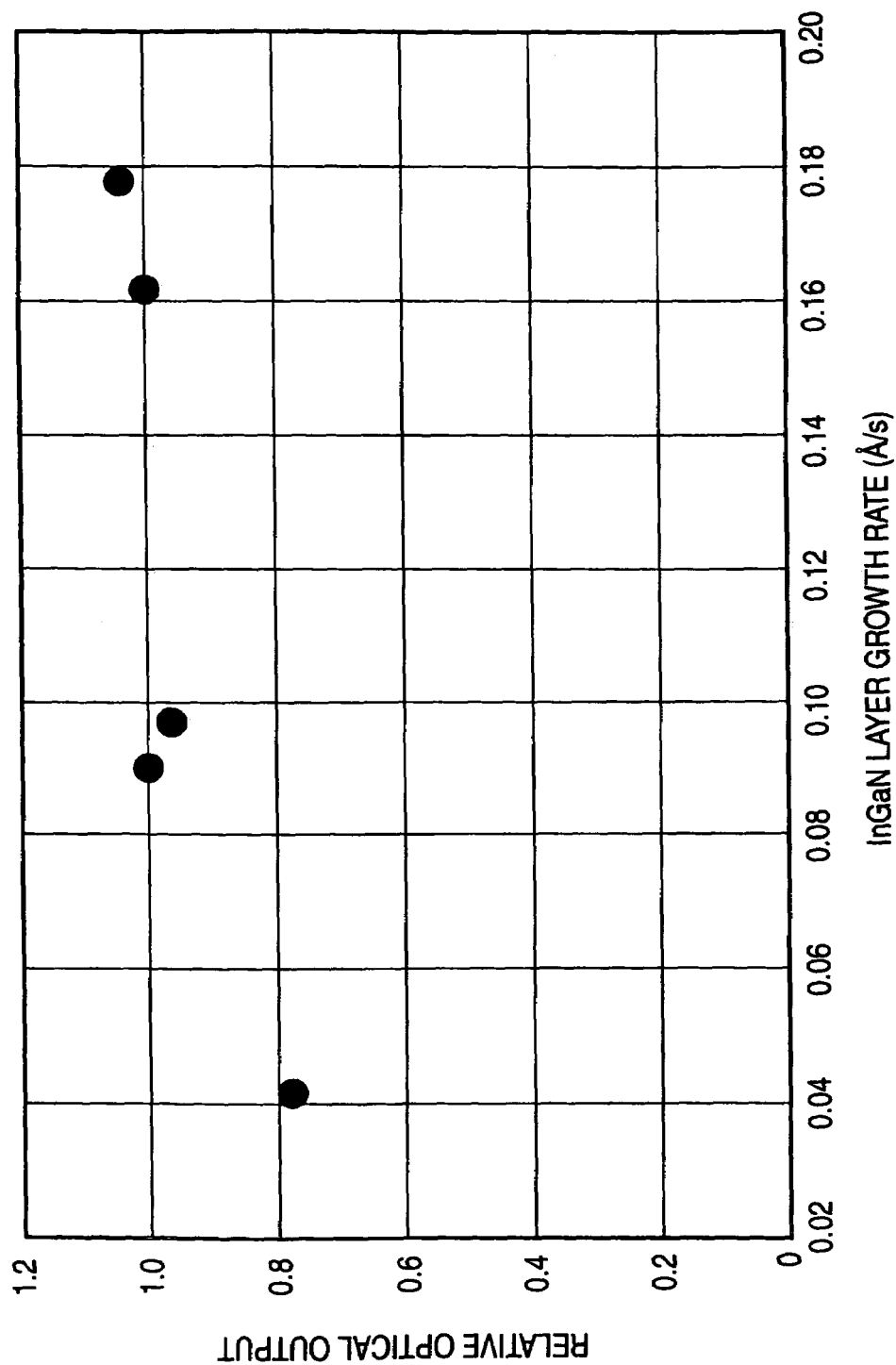
FIG. 11 shows the relation between the growth rate of each InGaN well layer and the light-emitting intensity of the light-emitting device.

A result of FIG. 11 is obtained when the growth rate of each of InGaN well layers forming the multilayer is changed as shown in the horizontal axis in the light-emitting device shown in Embodiments. It is obvious from the result of FIG. 11 that the growth rate of each InGaN well layer is selected to be preferably 0.08–0.18 Å/s (0.008–0.018 nm/s). For obtaining the result of FIG. 11, the flow rate of material gas (TMG, TMI, ammonia) is changed to control the growth rate.

Figure 12:
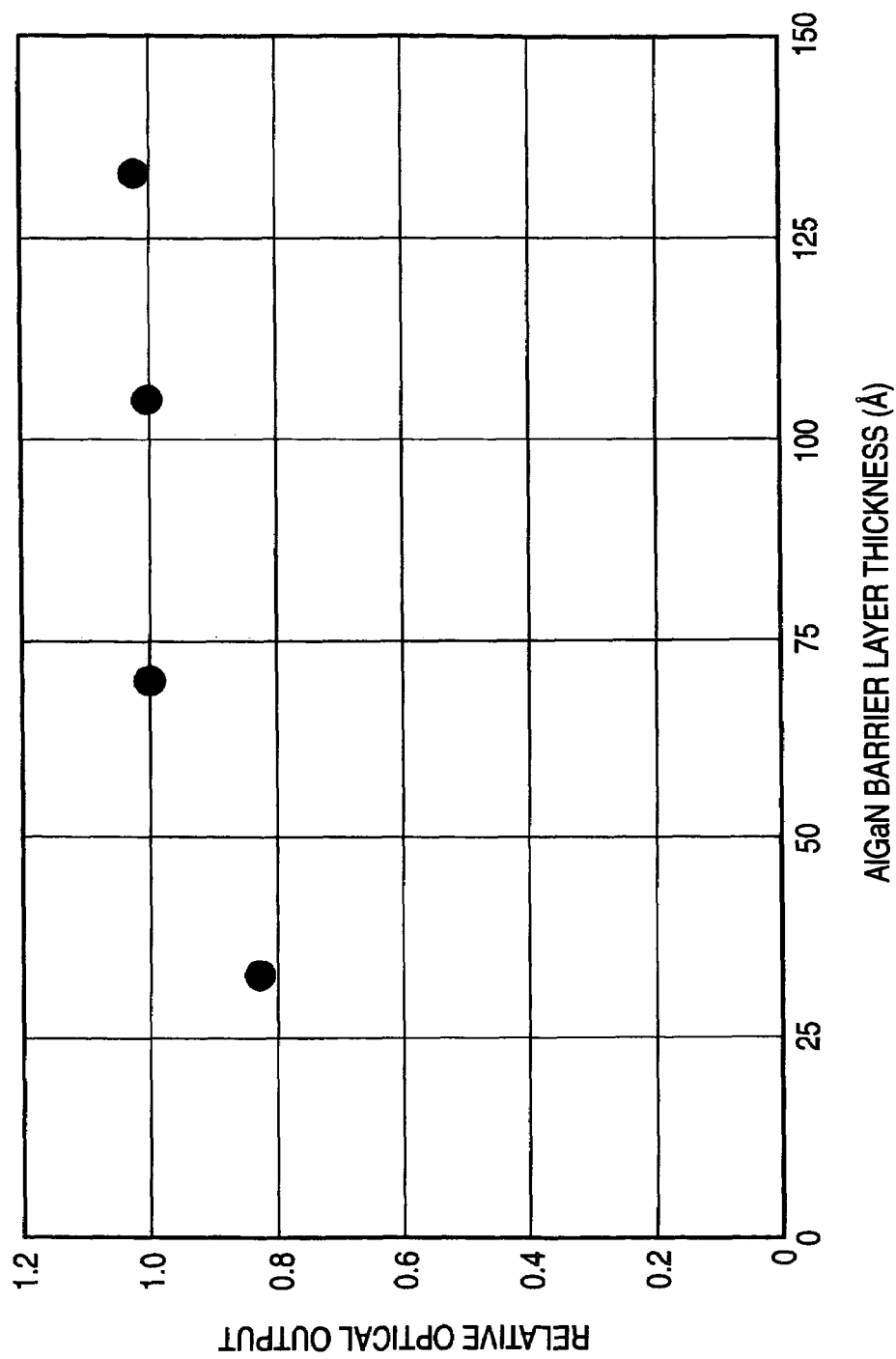
FIG. 12 shows the relation between the film thickness of each AlGaN layer as a barrier layer and the light-emitting intensity of the light-emitting device.

A result of FIG. 12 is obtained when the thickness of each of AlGaN layers is changed as shown in the horizontal axis in the light-emitting device shown in Embodiments. It is obvious from the result of FIG. 12 that the film thickness of each AlGaN layer is selected to be preferably 75–135 Å (7.5–13.5 nm). In an aspect of the invention, each barrier layer is preferably formed to be thicker than each well layer.

EMBODIMENTS

Embodiments of the invention will be described below.

First Embodiment

FIG. 6 shows a semiconductor laminated structure of a light-emitting diode 1 according to this embodiment.

Specifications of respective layers are as follows.

| Layer | Composition:Dopant | (Thickness) |
|---|---|---|
| Second p-type layer 17 | p-$Al_{0.02}Ga_{0.98}N$:Mg | (75 nm) |
| First p-type layer 16 | p-$Al_{0.10-0.45}Ga_{0.90-0.55}N$:Mg | (smaller than 70 nm) |
| Multilayer 15 | | |
| Uppermost layer 15d | $Al_{0.04-0.10}Ga_{0.96-0.90}N$ | (5–10.5 nm) |
| Barrier layer 15c | $Al_{0.04-0.10}Ga_{0.96-0.90}N$ | (5–10.5 nm) |
| Well layer 15b | $In_{0.01-0.07}Ga_{0.99-0.93}N$ | (3.5–5 nm) |
| Lowermost layer 15a | $Al_{0.04-0.10}Ga_{0.96-0.90}N$ | (5–10.5 nm) |
| Third intermediate layer 14c | $Al_{0.10-0.45}Ga_{0.90-0.55}N$ | (10 nm) |
| Second intermediate layer 14b | GaN | (10 nm) |
| First intermediate layer 14a | $In_{0.01-0.10}Ga_{0.99-0.90}N$ | (200 nm) |
| n-type later 13 | n-GaN:Si | (4 μm) |
| Buffer layer 12 | AlN | (20 nm) |
| Substrate 11 | sapphire (face a) | (350 μm) |

Incidentally, carrier concentration is as follows.

The carrier concentration in the second p-type layer 17 is not lower than $1\times10^{17}/cm^3$.

The carrier concentration in the first p-type layer 16 is $0.5$–$2.0\times10^{17}/cm^3$.

The intermediate layers 14a to 14c are substantially not doped.

The carrier concentration in the n-type layer 13 is not lower than $1.0\times10^{18}/cm^3$.

The substrate temperature (growth temperature) of the n-type layer 13, the first p-type layer 16 and the second p-type layer 17 is selected to be not lower than 1000° C. Although a so-called low-temperature buffer layer can be used as the buffer layer, a high-temperature buffer layer is employed in this embodiment (see Unexamined Japanese Patent Publication No. 2001-015443).

The light-emitting diode configured as described above is produced as follows.

First, while hydrogen gas is circulated into a reactor of an MOCVD apparatus, the sapphire substrate 11 is heated to 1130° C. so that a surface (face a) is cleaned.

Then, at the substrate temperature, TMA and $NH_3$ are introduced and the buffer layer 12 of AlN is grown by an MOCVD method.

Then, in the condition that the substrate temperature is kept at 1130° C., the n-type layer 13 is formed and Group III nitride compound semiconductor layers 14 to 17 following the n-type layer 13 are formed according to an ordinary method (MOCVD method).

In the MOCVD method, an ammonia gas and gases of Group III element alkyl compounds such as trimethylgallium (TMG), trimethylaluminum (TMA) and trimethylindium (TMI) are supplied onto the substrate heated to an appropriate temperature and are subjected to a heat decomposition reaction to thereby grow a desired crystal on the substrate. Silane or disilane is used for introducing silicon (Si) as impurities. $(RC_5H_4)_2Mg$ is used for introducing magnesium (Mg) as impurities.

As described above, the substrate temperature for growing the first intermediate 14a is preferably selected to be 770–875° C. (see FIG. 5). In this embodiment, the substrate temperature is selected to be 800° C.

The substrate temperature for growing each InGaN well layer 15b in the multilayer 15 is preferably selected to be 770–790° C. as shown in FIG. 3. In this embodiment, the substrate temperature is selected to be 780° C.

The growth temperature of the AlGaN layer 15a in the multilayer 15 is not particularly limited if the well layer containing indium (In) is not eliminated at this temperature. In this embodiment, the substrate temperature is selected to be 885° C.

The substrate temperature of the first p-type layer 16 and the second p-type layer 17 is kept at 1000° C.

Then, while Ti/Ni is used as a mask, the semiconductor layers are partially removed by reactive ion etching to thereby reveal the n-type layer 13 on which an n-electrode pad 21 will be formed (see FIG. 7).

A photo resist is applied on a semiconductor surface uniformly. The photo resist is removed from an electrode-forming portion on the second p-type layer 17 by photolithography to thereby reveal the portion of the second p-type layer 17. An Au—Co translucent electrode layer 19 is formed on the revealed second p-type layer 17 by an evaporation apparatus.

Then, a p-electrode pad 20 and an n-electrode pad 21 are vapor-deposited in the same manner as described above.

Short-wavelength light having a peak wavelength of 382 nm is emitted efficiently from the light-emitting diode configured as described above.

Second Embodiment

Figure 8:
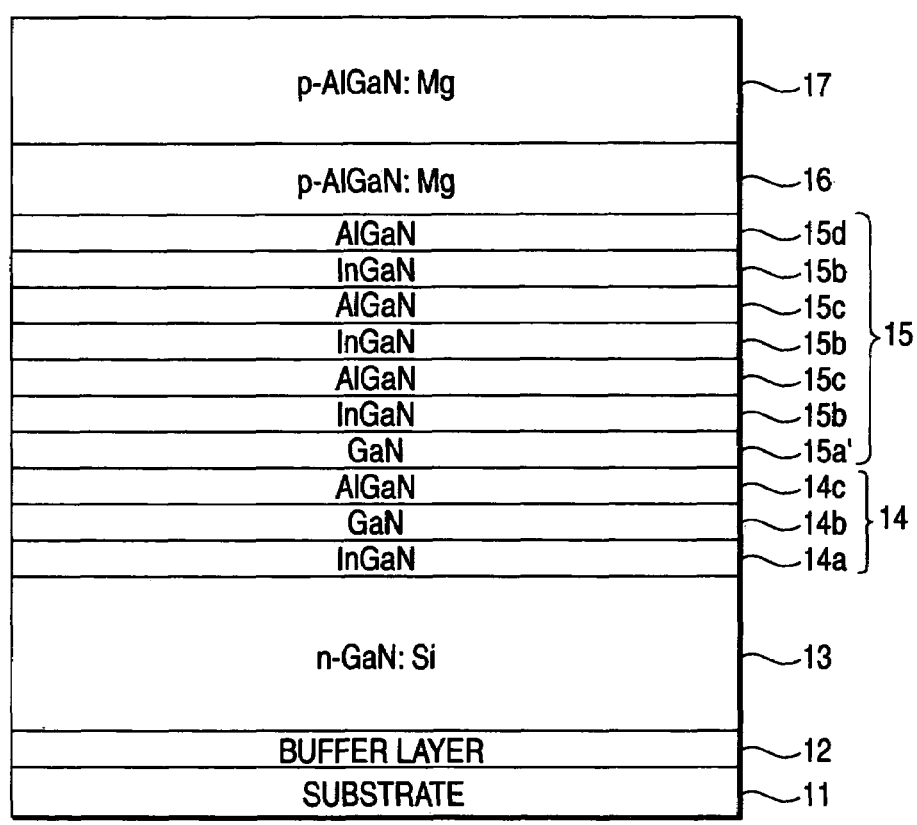
FIG. 8 shows Group III nitride compound semiconductor layers in a light-emitting device according to another embodiment.

This embodiment is configured in the same manner as in the first embodiment except that the lowermost layer 15a' of the multilayer 15 in the device according to the first embodiment is made of GaN as shown in FIG. 8.

Also in this embodiment, short-wavelength light having a peak wavelength of 382 nm is emitted efficiently.

Third Embodiment

Figure 9:
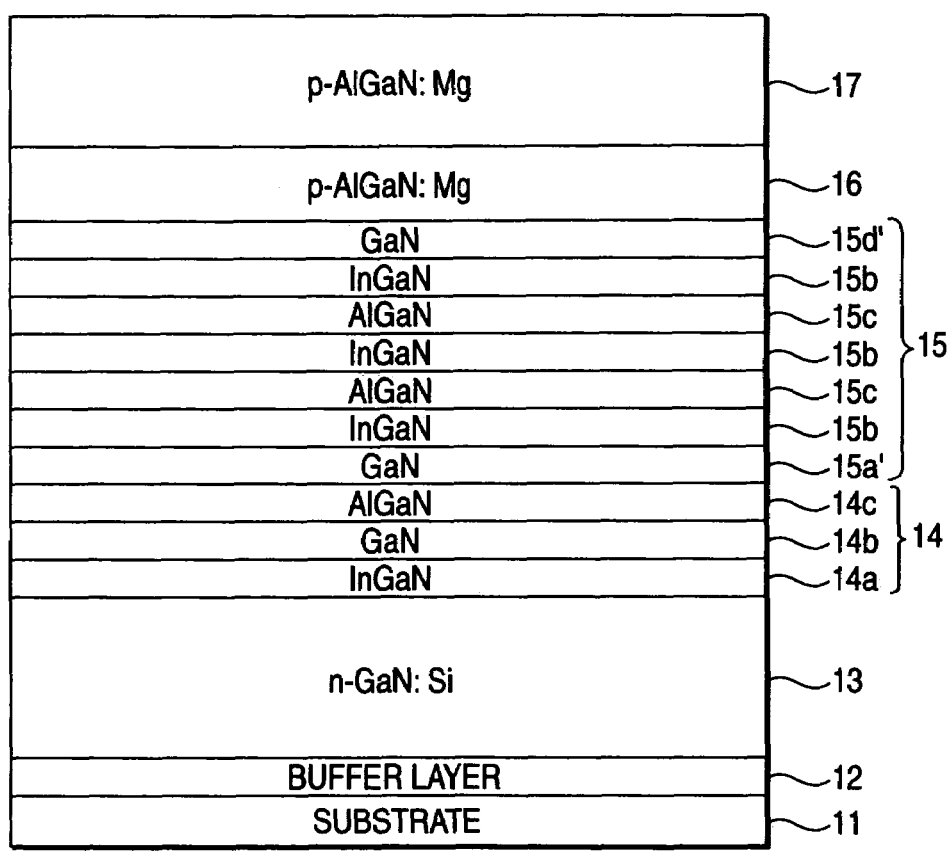
FIG. 9 shows Group III nitride compound semiconductor layers in a light-emitting device according to a further embodiment.

This embodiment is configured in the same manner as in the first embodiment except that the lowermost layer 15a' of the multilayer 15 in the device according to the first embodiment is made of GaN and the upper most layer 15d' thereof is made of GaN as shown in FIG. 9.

Also in this embodiment, short-wavelength light having a peak wavelength of 382 nm is emitted efficiently.

Fourth Embodiment

The semiconductor configuration of a light-emitting diode according to this embodiment is the same as shown in FIG. 6. Specifications of respective layers are as follows.

| Layer | Composition:Dopant | (Thickness) |
|---|---|---|
| Second p-type layer 17 | p-$Al_{0.02}Ga_{0.98}N$:Mg | (75 nm) |
| First p-type layer 16 | p-$Al_{0.10-0.45}Ga_{0.90-0.55}N$:Mg | (smaller than 70 nm) |

-continued

| Layer | Composition:Dopant | (Thickness) |
|---|---|---|
| Multilayer 15 | | |
| Uppermost layer 15d | $Al_{0.04-0.20}Ga_{0.96-0.80}N$ | (5–18.0 nm) |
| Barrier layer 15c | $Al_{0.04-0.20}Ga_{0.96-0.80}N$ | (5–13.5 nm) |
| Well layer 15b | $In_{0.01-0.20}Ga_{0.99-0.80}N$ | (2–6 nm) |
| Lowermost layer 15a | $Al_{0.04-0.20}Ga_{0.96-0.80}N$ | (5–13.5 nm) |
| Third intermediate layer 14c | $Al_{0.10-0.45}Ga_{0.90-0.55}N$ | (10 nm) |
| Second intermediate layer 14b | GaN | (10 nm) |
| First intermediate layer 14a | $In_{0.01-0.10}Ga_{0.99-0.90}N$ | (200 nm) |
| n-type later 13 | n-GaN:Si | (4 μm) |
| Buffer layer 12 | AlN | (20 nm) |
| Substrate 11 | sapphire (face a) | (350 μm) |

Incidentally, carrier concentration is as follows.

The carrier concentration in the second p-type layer 17 is not lower than $5 \times 10^{16}/cm^3$.

The carrier concentration in the first p-type layer 16 is $0.5-2.0 \times 10^{17}/cm^3$.

The intermediate layers 14a to 14c are substantially not doped.

The carrier concentration in the n-type layer 13 is not lower than $1.0 \times 10^{18}/cm^3$.

INDUSTRIAL APPLICABILITY

The invention is not limited to the description of the mode for carrying out the invention and the embodiments thereof at all, but includes various modifications that can be conceived easily by those skilled in the art, without departing from the scope of claim for a patent.

This application is based on Japanese Patent Application (Patent Application No. 2001-128507) filed on Apr. 25, 2001 and Japanese Patent Application (Patent Application No. 2001-167589) filed on Jun. 4, 2001, the entirety of which is incorporated herein by reference.

The following items are disclosed below.

1. A Group III nitride compound semiconductor light-emitting device for emitting light at a wavelength of 360–550 nm, including: a multilayer containing a quantum well structure having an InGaN well layer and an AlGaN barrier layer; and an intermediate layer of InGaN thicker than the InGaN well layer and disposed below the multilayer, wherein the Group III nitride compound semiconductor light-emitting device satisfies at least one of the following requirements (2) to (5):
   (2) the film thickness of the InGaN well layer is 9.0–20.0 nm;
   (3) the growth rate of the InGaN well layer is 0.025–0.035 nm/s;
   (4) the growth temperature of the InGaN well layer is 770–790° C.; and
   (5) the film thickness of the AlGaN layer is 5.0–12.5 nm.
2. A Group III nitride compound semiconductor light-emitting device according to the item 1, wherein the InGaN well layer is thicker than the AlGaN layer.
2-1. A Group III nitride compound semiconductor light-emitting device according to the item 1 or 2, further including a second intermediate layer formed between the quantum well structure and the InGaN intermediate layer and made of GaN.
2-2. A Group III nitride compound semiconductor light-emitting device according to the item 1 or 2, further including a second intermediate layer formed between the quantum well structure and the InGaN intermediate layer and made of GaN and AlGaN.
2-3. A Group III nitride compound semiconductor light-emitting device according to the item 1 or 2, further including a second intermediate layer formed between the quantum well structure and the InGaN intermediate layer and made of AlGaN.
3. A Group III nitride compound semiconductor light-emitting device according to the item 1 or 2, wherein an intermediate layer obtained by laminating a first intermediate layer of InGaN, a second intermediate layer of GaN and a third intermediate layer of AlGaN successively is formed under the multilayer.
4. A Group III nitride compound semiconductor light-emitting device according to the item 3, wherein the intermediate layer substantially contains no impurities.
5. A Group III nitride compound semiconductor light-emitting device according to the item 3 or 4, wherein: the lowermost layer of the multilayer being in contact with the third intermediate layer is made of AlGaN or GaN; and the uppermost layer of the multilayer being in contact with a p-type layer is made of AlGaN or GaN.
6. A Group III nitride compound semiconductor light-emitting device according to the item 5, wherein: the lowermost layer is made of AlGaN; and the uppermost layer is made of AlGaN.
7. A Group III nitride compound semiconductor light-emitting device according to the item 5, wherein: the lowermost layer is made of GaN; and the uppermost layer is made of GaN.
8. A Group III nitride compound semiconductor light-emitting device according to the item 5, wherein: the lowermost layer is made of GaN; and the uppermost layer is made of AlGaN.
9. A Group III nitride compound semiconductor light-emitting device according to any one of the items 3 through 8, wherein the growth temperature of the first intermediate layer of InGaN is 770–875° C.
11. A method of producing a Group III nitride compound semiconductor light-emitting device having a multilayer having a quantum well structure having an InGaN well layer and AlGaN barrier layers as layers for emitting light at a wavelength of 360–550 nm, the method of producing a Group III nitride compound semiconductor light-emitting device executing at least any one of the following requirements (3) and (4):
   (3) the growth rate of the InGaN well layer is 0.025–0.035 nm/s; and
   (4) the growth temperature of each of the InGaN well layer is 770–790° C.
12. A method of producing a Group III nitride compound semiconductor light-emitting device according to the item 11, wherein an intermediate layer obtained by laminating a first intermediate layer of InGaN, a second intermediate layer of GaN and a third intermediate layer of AlGaN successively is formed under the multilayer in the Group III nitride compound semiconductor light-emitting device in the condition that the first intermediate layer of InGaN is formed at a growth temperature of 770–875° C.
21. A Group III nitride compound semiconductor light-emitting device including: a multilayer containing a quantum well structure having an InGaN well layer and AlGaN barrier layers; and an intermediate layer of InGaN thicker than the InGaN well layer and disposed below the multilayer, wherein the Group III nitride compound semiconductor light-emitting device satisfies at least one of the following requirements (2) to (5):
(2) the film thickness of the InGaN well layer is 9.0–20.0 nm;
(3) the growth rate of the InGaN well layer is 0.025–0.035 nm/s;
(4) the growth temperature of the InGaN well layer is 770–790° C.; and
(5) the film thickness of the AlGaN layer is 5.0–12.5 nm.

22. A Group III nitride compound semiconductor light-emitting device according to the item 21, wherein the InGaN well layer is thicker than the AlGaN layer.

22-1. A Group III nitride compound semiconductor light-emitting device according to the item 21 or 22, further including a second intermediate layer formed between the quantum well structure and the InGaN intermediate layer and made of GaN.

22-2. A Group III nitride compound semiconductor light-emitting device according to the item 21 or 22, further including a second intermediate layer formed between the quantum well structure and the InGaN intermediate layer and made of GaN and AlGaN.

22-3. A Group III nitride compound semiconductor light-emitting device according to the item 21 or 22, further including a second intermediate layer formed between the quantum well structure and the InGaN intermediate layer and made of AlGaN.

23. A Group III nitride compound semiconductor light-emitting device according to the item 21 or 22, wherein an intermediate layer obtained by laminating a first intermediate layer of InGaN, a second intermediate layer of GaN and a third intermediate layer of AlGaN successively is formed under the multilayer.

24. A Group III nitride compound semiconductor light-emitting device according to the item 23, wherein the intermediate layer substantially contains no impurities.

25. A Group III nitride compound semiconductor light-emitting device according to the item 23 or 24, wherein: the lowermost layer of the multilayer being in contact with the third intermediate layer is made of AlGaN or GaN; and the uppermost layer of the multilayer being in contact with a p-type layer is made of AlGaN or GaN.

26. A Group III nitride compound semiconductor light-emitting device according to the item 25, wherein: the lowermost layer is made of AlGaN; and the uppermost layer is made of AlGaN.

27. A Group III nitride compound semiconductor light-emitting device according to the item 25, wherein: the lowermost layer is made of GaN; and the uppermost layer is made of GaN.

28. A Group III nitride compound semiconductor light-emitting device according to the item 25, wherein: the lowermost layer is made of GaN; and the uppermost layer is made of AlGaN.

29. A Group III nitride compound semiconductor light-emitting device according to any one of the items 23 through 28, wherein the growth temperature of the first intermediate layer of InGaN is 770–875° C.

31. A laminate including a quantum well structure having an InGaN well layer and AlGaN barrier layers, wherein the laminate satisfies at least one of the following requirements (2) to (5):
(2) the film thickness of the InGaN well layer is 9.0–20.0 nm;
(3) the growth rate of the InGaN well layer is 0.025–0.035 nm/s;
(4) the growth temperature of the InGaN well layer is 770–990° C.; and
(5) the film thickness of the AlGaN layer is 5.0–12.5 nm.

32. A laminate according to the item 31, wherein the InGaN well layer is thicker than the AlGaN layer.

32-1. A laminate according to the item 31 or 32, further including a second intermediate layer formed between the quantum well structure and the InGaN intermediate layer and made of GaN.

32-2. A laminate according to the item 31 or 32, further including a second intermediate layer formed between the quantum well structure and the InGaN intermediate layer and made of GaN and AlGaN.

32-3. A laminate according to the item 31 or 32, further including a second intermediate layer formed between the quantum well structure and the InGaN intermediate layer and made of AlGaN.

33. A laminate according to the item 31 or 32, wherein an intermediate layer obtained by laminating a first intermediate layer of InGaN, a second intermediate layer of GaN and a third intermediate layer of AlGaN successively is formed under the multilayer.

34. A laminate according to the item 33, wherein the intermediate layer substantially contains no impurities.

35. A laminate according to the item 33 or 34, wherein: the lowermost layer of the multilayer being in contact with the third intermediate layer is made of AlGaN or GaN; and the uppermost layer of the multilayer being in contact with a p-type layer is made of AlGaN or GaN.

36. A laminate according to the item 35, wherein: the lowermost layer is made of AlGaN; and the uppermost layer is made of AlGaN.

37. A laminate according to the item 35, wherein: the lowermost layer is made of GaN; and the uppermost layer is made of GaN.

38. A laminate according to the item 35, wherein: the lowermost layer is made of GaN; and the uppermost layer is made of AlGaN.

39. A laminate according to any one of the items 33 through 38, wherein the growth temperature of the first intermediate layer of InGaN is 770–875° C.

40. A laminate according to any one of the items 31 through 39, wherein the multilayer contains light-emitting layers.

41. A method of producing a Group III nitride compound semiconductor light-emitting device having a multilayer containing a quantum well structure having an InGaN-well layer and an AlGaN barrier layer, the method of producing a Group III nitride compound semiconductor light-emitting device executing at least any one of the following requirements (3) and (4):
(3) the growth rate of the InGaN well layer is 0.025–0.035 nm/s; and
(4) the growth temperature of the InGaN well layer is 770–790° C.

42. A method of producing a Group III nitride compound semiconductor light-emitting device according to the item 41, wherein an intermediate layer obtained by laminating a first intermediate layer of InGaN, a second intermediate layer of GaN and a third intermediate layer of AlGaN successively is formed under the multilayer in the Group III nitride compound semiconductor light-emitting device in the condition that the first intermediate layer of InGaN is formed at a growth temperature of 770–875° C.

51. A method of producing a laminate having a multilayer containing a quantum well structure having an InGaN well layer and AlGaN barrier layers, the method of producing a laminate executing at least any one of the following requirements (3) and (4):
(3) the growth rate of the InGaN well layer is 0.025–0.035 nm/s; and
(4) the growth temperature of the InGaN well layer is 770–7.90° C.
52. A method of producing a laminate according to the item 51, wherein an intermediate layer obtained by laminating a first intermediate layer of InGaN, a second intermediate layer of GaN and a third intermediate layer of AlGaN successively is formed under the multilayer in the condition that the first intermediate layer of InGaN is formed at a growth temperature of 770–875° C.
101. A Group III nitride compound semiconductor light-emitting device for emitting light at a wavelength of 360–430 nm, including: a multilayer containing a quantum well structure having an InGaN well layer and an AlGaN barrier layer; and an intermediate layer of InGaN thicker than the InGaN well layer and disposed below the multilayer, wherein the Group III nitride compound semiconductor light-emitting device satisfies at least one of the following requirements (2) to (5):
(2) the film thickness of the InGaN well layer is 2.0–6.0 nm;
(3) the growth rate of the InGaN well layer is 0.008–0.018 nm/s;
(4) the growth temperature of the InGaN well layer is 770–790° C.; and
(5) the film thickness of the AlGaN layer is 7.5–13.5 nm.
102. A Group III nitride compound semiconductor light-emitting device according to the item 101, wherein the AlGaN layer is thicker than the InGaN well layer.
102-1. A Group III nitride compound semiconductor light-emitting device according to the item 101 or 102, further including a second intermediate layer formed between the quantum well structure and the InGaN intermediate layer and made of GaN.
102-2. A Group III nitride compound semiconductor light-emitting device according to the item 101 or 102, further including a second intermediate layer formed between the quantum well structure and the InGaN intermediate layer and made of GaN and AlGaN.
102-3. A Group III nitride compound semiconductor light-emitting device according to the item 101 or 102, further including a second intermediate layer formed between the quantum well structure and the InGaN intermediate layer and made of AlGaN.
103. A Group III nitride compound semiconductor light-emitting device according to the item 101 or 102, wherein an intermediate layer obtained by laminating a first intermediate layer of InGaN, a second intermediate layer of GaN and a third intermediate layer of AlGaN successively is formed under the multilayer.
104. A Group III nitride compound semiconductor light-emitting device according to the item 103, wherein the intermediate layer substantially contains no impurities.
105. A Group III nitride compound semiconductor light-emitting device according to the item 103 or 104, wherein: the lowermost layer of the multilayer being in contact with the third intermediate layer is made of AlGaN or GaN; and the uppermost layer of the multilayer being in contact with a p-type layer is made of AlGaN or GaN.
106. A Group III nitride compound semiconductor light-emitting device according to the item 105, wherein: the lowermost layer is made of AlGaN; and the uppermost layer is made of AlGaN.
107. A Group III nitride compound semiconductor light-emitting device according to the item 105, wherein: the lowermost layer is made of GaN; and the uppermost layer is made of GaN.
108. A Group III nitride compound semiconductor light-emitting device according to the item 105, wherein: the lowermost layer is made of GaN; and the uppermost layer is made of AlGaN.
109. A Group III nitride compound semiconductor light-emitting device according to any one of the items 103 through 108, wherein the growth temperature of the first intermediate layer of InGaN is 770–875° C.
111. A method of producing a Group III nitride compound semiconductor light-emitting device having a multilayer having a quantum well structure having an InGaN well layer and AlGaN barrier layers as layers for emitting light at a wavelength of 360–430 nm, the method of producing a Group III nitride compound semiconductor light-emitting device executing at least any one of the following requirements (3) and (4):
(3) the growth rate of the InGaN well layer is 0.008–0.018 nm/s; and
(4) the growth temperature of the InGaN well layer is 770–790° C.
112. A method of producing a Group III nitride compound semiconductor light-emitting device according to the item 111, wherein an intermediate layer obtained by laminating a first intermediate layer of InGaN, a second intermediate layer of GaN and a third intermediate layer of AlGaN successively is formed under the multilayer in the Group III nitride compound semiconductor light-emitting device in the condition that the first intermediate layer of InGaN is formed at a growth temperature of 770–875° C.
121. A Group III nitride compound semiconductor light-emitting device including: a multilayer containing a quantum well structure having an InGaN well layer and AlGaN barrier layers; and an intermediate layer of InGaN thicker than the InGaN well layer and disposed below the multilayer, wherein the Group III nitride compound semiconductor light-emitting device satisfies at least one of the following requirements (2) to (5):
(2) the film thickness of the InGaN well layer is 2.0–6.0 nm;
(3) the growth rate of the InGaN well layer is 0.008–0.018 nm/s;
(4) the growth temperature of the InGaN well layer is 770–790° C.; and
(5) the film thickness of the AlGaN layer is 7.5–13.5 nm.
122. A Group III nitride compound semiconductor light-emitting device according to the item 121, wherein the AlGaN layer is thicker than the InGaN well layer.
122-1. A Group III nitride compound semiconductor light-emitting device according to the item 121 or 122, further including a second intermediate layer formed between the quantum well structure and the InGaN intermediate layer and made of GaN.
122-2. A Group III nitride compound semiconductor light-emitting device according to the item 121 or 122, further including a second intermediate layer formed between the quantum well structure and the InGaN intermediate layer and made of GaN and AlGaN.
122-3. A Group III nitride compound semiconductor light-emitting device according to the item 121 or 122, further including a second intermediate layer formed between the quantum well structure and the InGaN intermediate layer and made of AlGaN.

123. A Group III nitride compound semiconductor light-emitting device according to the item 121 or 122, wherein an intermediate layer obtained by laminating a first intermediate layer of InGaN, a second intermediate layer of GaN and a third intermediate layer of AlGaN successively is formed under the multilayer.

124. A Group III nitride compound semiconductor light-emitting device according to the item 123, wherein the intermediate layer substantially contains no impurities.

125. A Group III nitride compound semiconductor light-emitting device according to the item 123 or 124, wherein: the lowermost layer of the multilayer being in contact with the third intermediate layer is made of AlGaN or GaN; and the uppermost layer of the multilayer being in contact with a p-type layer is made of AlGaN or GaN.

126. A Group III nitride compound semiconductor light-emitting device according to the item 125, wherein: the lowermost layer is made of AlGaN; and the uppermost layer is made of AlGaN.

127. A Group III nitride compound semiconductor light-emitting device according to the item 125, wherein: the lowermost layer is made of GaN; and the uppermost layer is made of GaN.

128. A Group III nitride compound semiconductor light-emitting device according to the item 125, wherein: the lowermost layer is made of GaN; and the uppermost layer is made of AlGaN.

129. A Group III nitride compound semiconductor light-emitting device according to any one of the items 123 through 128, wherein the growth temperature of the first intermediate layer of InGaN is 770–875° C.

131. A laminate including a quantum well structure having an InGaN well layer and AlGaN barrier layers, wherein the laminate satisfies at least one of the following requirements (2) to (5):
(2) the film thickness of the InGaN well layer is 2.0–6.0 nm;
(3) the growth rate of the InGaN well layer is 0.008–0.018 nm/s;
(4) the growth temperature of the InGaN well layer is 770–790° C.; and
(5) the film thickness of the AlGaN layer is 7.5–13.5 nm.

132. A laminate according to the item 131, wherein the AlGaN layer is thicker than the InGaN well layer.

132-1. A laminate according to the item 131 or 132, further including a second intermediate layer formed between the quantum well structure and the InGaN intermediate layer and made of GaN.

132-2. A laminate according to the item 131 or 132, further including a second intermediate layer formed between the quantum well structure and the InGaN intermediate layer and made of GaN and AlGaN.

132-3. A laminate according to the item 131 or 132, further including a second intermediate layer formed between the quantum well structure and the InGaN intermediate layer and made of AlGaN.

133. A laminate according to the item 131 or 132, wherein an intermediate layer obtained by laminating a first intermediate layer of InGaN, a second intermediate layer of GaN and a third intermediate layer of AlGaN successively is formed under the multilayer.

134. A laminate according to the item 133, wherein the intermediate layer substantially contains no impurities.

135. A laminate according to the item 133 or 134, wherein: the lowermost layer of the multilayer being in contact with the third intermediate layer is made of AlGaN or GaN; and the uppermost layer of the multilayer being in contact with a p-type layer is made of AlGaN or GaN.

136. A laminate according to the item 135, wherein: the lowermost layer is made of AlGaN; and the uppermost layer is made of AlGaN.

137. A laminate according to the item 135, wherein: the lowermost layer is made of GaN; and the uppermost layer is made of GaN.

138. A laminate according to the item 135, wherein: the lowermost layer is made of GaN; and the uppermost layer is made of AlGaN.

139. A laminate according to any one of the items 133 through 138, wherein the growth temperature of the first intermediate layer of InGaN is 770–875° C.

140. A laminate according to any one of the items 131 through 139, wherein the multilayer contains light-emitting layers.

141. A method of producing a Group III nitride compound semiconductor light-emitting device having a multilayer containing a quantum well structure having an InGaN well layer and an AlGaN barrier layer, the method of producing a Group III nitride compound semiconductor light-emitting device executing at least any one of the following requirements (3) and (4):
(3) the growth rate of the InGaN well layer is 0.008–0.018 nm/s; and
(4) the growth temperature of the InGaN well layer is 770–790° C.

142. A method of producing a Group III nitride compound semiconductor light-emitting device according to the item 141, wherein an intermediate layer obtained by laminating a first intermediate layer of InGaN, a second intermediate layer of GaN and a third intermediate layer of AlGaN successively is formed under the multilayer in the Group III nitride compound semiconductor light-emitting device in the condition that the first intermediate layer of InGaN is formed at a growth temperature of 770–875° C.

151. A method of producing a laminate having a multilayer containing a quantum well structure having an InGaN well layer and AlGaN barrier layers, the method for producing a laminate executing at least any one of the following requirements (3) and (4):
(3) the growth rate of the InGaN well layer is 0.008–0.018 nm/s; and
(4) the growth temperature of the InGaN well layer is 770–790° C.

152. A method of producing a laminate according to the item 151, wherein an intermediate layer obtained by laminating a first intermediate layer of InGaN, a second intermediate layer of GaN and a third intermediate layer of AlGaN successively is formed under the multilayer in the condition that the first intermediate layer of InGaN is formed at a growth temperature of 770° C.–875° C.

The invention claimed is:
1. A Group III nitride compound semiconductor light-emitting device comprising:
a multilayer having a quantum well structure containing an InGaN well layer and an AlGaN barrier layer; and
an intermediate layer under said multilayer,
wherein said intermediate layer comprises:
a first intermediate layer of InGaN thicker than said InGaN well layer,
a second intermediate layer on said first intermediate layer, and
a third intermediate layer of AlGaN on said second intermediate layer.

2. The Group III nitride compound semiconductor light-emitting device according to claim 1, wherein said second intermediate layer comprises GAN.

3. The Group III nitride compound semiconductor light-emitting device according to claim 1, wherein said second intermediate layer comprises AlGaN.

4. The Group III nitride compound semiconductor light-emitting device according to claim 1, wherein said second intermediate layer comprises at least one of GaN and AlGaN.

5. A Group III nitride compound semiconductor light-emitting device according to claim 1, wherein said first intermediate layer substantially contains no impurities.

6. A Group III nitride compound semiconductor light-emitting device according to claim 2, wherein each of said first and second intermediate layers substantially contains no impurities.

7. A Group III nitride compound semiconductor light-emitting device according to claim 3, wherein each of said first and second intermediate layers substantially contains no impurities.

8. A Group III nitride compound semiconductor light-emitting device according to claim 4, wherein each of said first and second intermediate layers substantially contains no impurities.

9. A Group III nitride compound semiconductor light-emitting device according to claim 1, wherein each of said first, second and third intermediate layers substantially contains no impurities.

10. The Group III nitride compound semiconductor light-emitting device according to claim 1, wherein:
a lowermost layer of said multilayer, being in contact with said third intermediate layer, comprises at least one of AlGaN and GaN; and
an uppermost layer of said multilayer, being in contact with a p-type layer, comprises at least one of AlGaN and GaN.

11. A Group III nitride compound semiconductor light-emitting device according to claim 1, wherein growth temperature of said first intermediate layer of InGaN is 770–875° C.

12. A method of producing the Group III nitride compound semiconductor light-emitting device of claim 1, the method comprising:
forming said first intermediate layer of InGaN below said multilayer in a condition that said first intermediate layer of InGaN is formed at a growth temperature of about 770 to about 875 degrees Celsius.

13. The device of claim 1, wherein said InGaN well layer has a thickness of from about 9.0 to about 20.0 nm.

14. The device of claim 1, wherein said AlGaN barrier layer has a thickness of from about 5.0 to about 12.5 nm.

15. The device of claim 1, wherein said InGaN well layer has a thickness of from about 2.0 to about 6.0 nm.

16. The device of claim 1, wherein said AlGaN barrier layer has a thickness of from about 7.5 to about 13.5 nm.

17. The device of claim 1, wherein said AlGaN barrier layer is thicker than said InGaN well layer in said quantum well structure.

18. A Group III nitride compound semiconductor light-emitting device comprising:
a multilayer having a quantum well structure; and
an intermediate layer under said multilayer,
wherein said intermediate layer comprises:
a first intermediate layer thicker than a well layer in said quantum well structure,
a second intermediate layer on said first intermediate layer, and
a third intermediate layer on said second intermediate layer.

19. The device of claim 18, wherein said third intermediate layer comprises AlGaN.

20. The device of claim 18, wherein said first intermediate layer comprises InGaN and wherein said second intermediate layer comprises at least one GaN, and AlGaN.

* * * * *